United States Patent [19]

Sone

[11] Patent Number: 4,489,424
[45] Date of Patent: Dec. 18, 1984

[54] FREQUENCY DIVIDER MAKING USE OF JOSEPHSON JUNCTION CIRCUITS

[75] Inventor: Junichi Sone, Tokyo, Japan

[73] Assignee: Nippon Electric Co., Ltd., Tokyo, Japan

[21] Appl. No.: 376,994

[22] Filed: May 11, 1982

[30] Foreign Application Priority Data

May 14, 1981 [JP] Japan ................................. 56-72506

[51] Int. Cl.³ ...................... H03K 21/00; H03K 23/24
[52] U.S. Cl. ...................................... 377/93; 307/277; 307/306
[58] Field of Search ...................... 307/245, 277, 306; 357/5; 377/93; 365/162

[56] References Cited

U.S. PATENT DOCUMENTS 3,218,471 11/1965 Rosenberg ........................... 307/277
4,144,465 3/1979 Faris ..................................... 307/277

OTHER PUBLICATIONS

D. J. Herrell et al., "Binary Counter Circuit", IBM Technical Disclosure Bulletin vol. 17, No. 10, Mar., 1975, pp. 3049-3050.

*Primary Examiner*—John Zazworsky
*Attorney, Agent, or Firm*—Sughrue, Mion, Zinn, Macpeak & Seas

[57] ABSTRACT

A frequency divider is provided by coupling the gate current paths of a pair of Josephson junction gate circuits in parallel with the control current path of a third Josephson junction gate circuit being connected in series with the gate current path of one of the first pair of Josephson junctions. The gate current path of the third Josephson junction is connected in series with the control current path of the other of the first pair of Josephson junctions, and an input signal to be frequency divided is connected in common to the connection point of the control current path of the first Josephson junction and gate current path of the third Josephson junction. Current flowing through the control current path of the first Josephson junction will be at one-half the frequency of the input current. A plurality of frequency dividers may be cascaded to perform $\frac{1}{2}^N$ frequency division.

9 Claims, 5 Drawing Figures

FREQUENCY DIVIDER MAKING USE OF JOSEPHSON JUNCTION CIRCUITS

BACKGROUND OF THE INVENTION

The present invention relates to a frequency divider making use of Josephson junction circuits, and more particularly to a frequency divider having an operation frequency range extending even to a hundred GHz.

The upper limit of the frequencies at which frequency-division can be preformed in a frequency divider that is available in direct measurement of a frequency, microwave communication, etc. is restricted by the switching time of switching elements used in the frequency divider. Heretofore, semiconductor integrated circuit frequency dividers have been developed on a Si or GaAs substrate in which Si devices or GaAs devices are used for the switching element. However, because of a limit of the switching speed of semiconductor devices forming these frequency dividers, it was difficult to realize a frequency divider operable at 1 GHz or higher in a Si integrated circuit and a frequency divider operable at 4 GHz or higher in a GaAs integrated circuit. Accordingly it is not possible to apply the aforementioned semiconductor integrated circuit frequency divider to direct measurement of a frequency or microwave communication and the like in a high frequency band such as a 10 GHz or 20 GHz band.

On the other hand, it has been reported that a Josephson junction device that operates at a very low temperature has a switching time of about 10 ps. Therefore, there is a possibility that a frequency divider operable up to a frequency of a hundred GHz can be made by a circuit employing such Josephson junction devices. However, a frequency divider employing such Josephson junction devices has not been proposed up to now.

If a frequency divider making use of the Josephson junction circuits is realized, it may be applied, as another field of application, to frequency-division of a clock frequency in an electronic computer. In an electronic computer making use of the Josephson junction integrated circuits, it is necessary to immerse all the Josephson junction circuits having a logic function, a memory function, a control function, etc. in liquid He, because the Josephson junction integrated circuit can operate only at a very low temperature in the proximity of the liquid He temperature. Accordingly, external timing pulses necessitated for accurately and efficiency actuating a logic circuit, a memory circuit, etc. which operate at various different speeds and at different timings also, should be preferably generated by means of Josephson junction circuits. To that end, it is necessary that a pulse generator for generating a pulse train having the same repetition frequency (fundamental frequency) as a signal fed from an oscillator held under a room temperature and a frequency divider for producing a timing pulse train having a frequency of ½, ¼ etc. of the fundamental frequency are realized by making use of Josephson junction circuits.

SUMMARY OF THE INVENTION

It is therefore one object of the present invention to provide a frequency divider making use of Josephson junction circuits which is operable in a high frequency range extending up to a hundred GHz and is simple in construction.

Another object of the present invention is to provide a frequency divider making use of Josephson junction circuits which is reliable in operation and in which coincidence of timing as its input and output can be easily attained.

Still another object of the present invention is to provide a frequency divider making use of Josephson junction circuits in which any desired frequency-division ratio can be realized.

A further object of the present invention is to provide a switching circuit employing Josephson junction devices which has a switching speed up to a hundred GHz.

According to one feature of the present invention, there is provided a frequency divider comprising first, second and third gate circuits each including a Josephson junction that presents either a voltage state or a zero voltage state depending upon a current flowing through a control current path, in which the gate current paths of the first and second gate circuits are connected in parallel to each other and a control current path of the third gate circuit is serially inserted between one of the junctions of the parallel connection and the gate current path of the first gate circuit, the one junction being connected to a terminal adapted to be fed with a D.C. current having a sufficient magnitude for bringing the third gate circuit into the voltage state, and the one junction being connected to a reference potential. An input terminal having an input pulse current to be frequency-divided fed thereto is connected to a series connection of a control current path of the first gate circuit and a first resistor having a predetermined resistance and is also connected to a series connection of a gate current path of the third gate circuit and a control current path of the second gate circuit. A frequency-divided output may be derived across the first resistor.

In order to achieve an initial operation in a stable and quick manner, the second gate circuit may be provided with another control current path connected to a terminal which is fed with an initial pulse current having a sufficient amplitude for bringing the second gate circuit into the voltage state.

A control current path of a fourth gate circuit may be serially inserted between the gate current path of the second gate circuit and ground, and a terminal adapted to be fed with a D.C. current having a predetermined magnitude is connected to one end of a gate current path of this fourth gate circuit, the other end thereof being grounded. Between the one end of the gate current path of the fourth gate circuit and ground a second resistor having a predetermined resistance is connected, and a frequency-divided output may be derived across this second resistor in addition to or instead of the output from the first resistor.

Furthermore, in order to enlarge the frequency-division ratio, a plurality of frequency divider circuits each constructed in the above-described manner may be cascaded. In such case, a control current path of a fifth gate circuit is inserted in series with the first or second resistor for deriving a frequency-divider output of the corresponding stage, one end of a gate current path of this fifth gate circuit being grounded and the other end thereof being connected to a terminal adapted to be fed with a D.C. current having a predetermined magnitude. The other end of the gate current path is connected to the input terminal of the frequency divider circuit in the next stage through a third resistor having a predetermined resistance.

Other objects and features of the present invention will become apparent by reference to the following description taken in conjunction with the accompanying drawings.

DETAILED DESCRIPTION OF THE PREFERRED EMBODIMENTS

Figure 1:
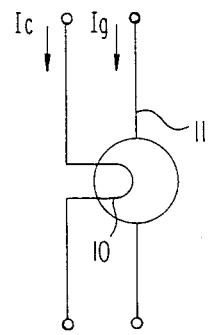
FIG. 1 shows a symbol representing a gate circuit including a Josephson junction to be utilized according to the present invention.

The Josephson junction gate circuits to be employed according to the present invention include the well-known in-line gate circuit and the interferometer gate circuit that is fully described in U.S. Pat. No. 3,978,351, and in either one of the gate circuits, a Josephson junction is controlled to take either the voltage state or the zero voltage state by controlling a threshold current $I_m$ of a gate current $I_g$ of the Josephson junction with a control current $I_c$ that is magnetically coupled to the gate current. In the illustration in the accompanying drawings, these gate circuits are represented by a symbol shown in FIG. 1. As is well known, in the gate circuit shown in FIG. 1, the Josephson junction is held in the zero voltage state when the control current $I_c$ is not flowing through a control current path 10, and in this state a gate current $I_g$ fed to a gate current path 11 would flow through the Josephson junction without a voltage drop. On the other hand, if the control current $I_c$ flows to apply a magnetic field to the Josephson junction, then the threshold current $I_m$ would change, hence the junction takes the voltage state, resulting in a voltage drop across its gate current path. In general, the interferometer gate circuit is more advantageous from the reasons that, as compared to the in-line gate circuit, it has a high sensitivity to an input signal current, a large versatility in design owing to a great number of design parameters, and a fast switching speed. Representative Josephson junctions, constructions of circuits therefor and methods for forming Josephson junctions are described in detail in U.S. Pat. Nos. 3,758,795 and 3,913,120.

Figure 2:
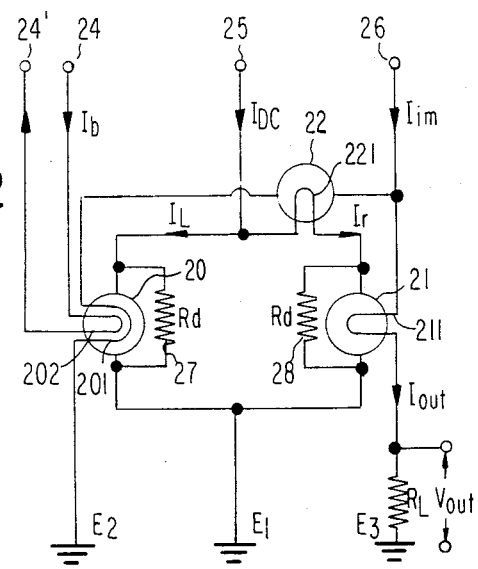
FIG. 2 is a basic circuit diagram of a frequency divider according to the present invention.

Referring now to FIG. 2 which shows a basic construction of the frequency divider according to the present invention, the frequency divider according to the present invention comprises three gate circuits 20, 21 and 22, and gate current paths of the gate circuits 20 and 21 and a control current path 221 of the gate circuit 22 are connected in series so as to form a loop. The junction between the gate current paths of the gate circuits 20 and 21 is grounded at $E_1$, and to the junction between the control current path 221 of the gate circuit 22 and the gate current path of the gate circuit 20 is connected a terminal 25 which is adapted to be fed with a D.C. current $I_{DC}$ having a predetermined magnitude.

In addition, one end of a gate current path of the gate circuit 22 is grounded at $E_2$ via a first control current path 201 of the gate circuit 20, the other end of the same gate current path is grounded at $E_3$ via a control current path 211 of the gate circuit 21 and a load resistor 23, and a pulse input current $I_{in}$ to be frequency-divided is fed to an input terminal 26 connected to the junction between the gate current path of the gate circuit 22 and the control current path 211 of the gate circuit 21. Here it is to be noted that the above-described respective connection lines are formed of superconductor lines. Moreover, in the gate circuits 20 and 21, for the purpose of preventing oscillation caused by the capacitance associated with the Josephson junction and the inductance possessed by the superconductor line, damping resistors 27 and 28 having a predetermined resistance $R_d$ are connected respectively in parallel to their gate current paths. With regard to the damping resistor, a detailed description is found in the article by W. H. Henkels entitled "Fundamental Criteria For the Design of High-performance Josephson Nondestructive Readout Random Access Memory Cells and Experimental Confirmation", Journal of Applied Physics, 50(12), December 1979, pp. 8143–8168.

The resistance $R_L$ of the load resistor 23 is chosen at a sufficiently small value as compared to the resistance of the Josephson junction of the gate circuit 22 when it is in the voltage stage, that is, the so-called sub-gap resistance $R_{sub}$. Furthermore, an initial pulse current $I_b$ having a sufficient amplitude for bringing terminals 24 and 24' are connected to the opposite ends of a second control current path 202 of the gate circuit 20. Prior to the commencement of the frequency division operation, an initial pulse current $I_b$ will be passed through the terminals 24 and 24', with pulse current $I_b$ having a sufficient amplitude to change the gate circuit 20 into its voltage state, thus ensuring that the current $I_{DC}$ initially flows through the control current path 221. As will become apparent from the subsequent explanation, the initial pulse current $I_b$ could be fed to a separate control current path provided additionally in the gate circuit 21 instead of the gate circuit 20. The frequency divider according to the present invention is constructed as described above, an input pulse signal $I_{in}$ to be frequency-divided is fed through the terminal 26, and a frequency-divided output signal is derived as a voltage $V_{out}$ across the load resistor 23.

Figure 3:
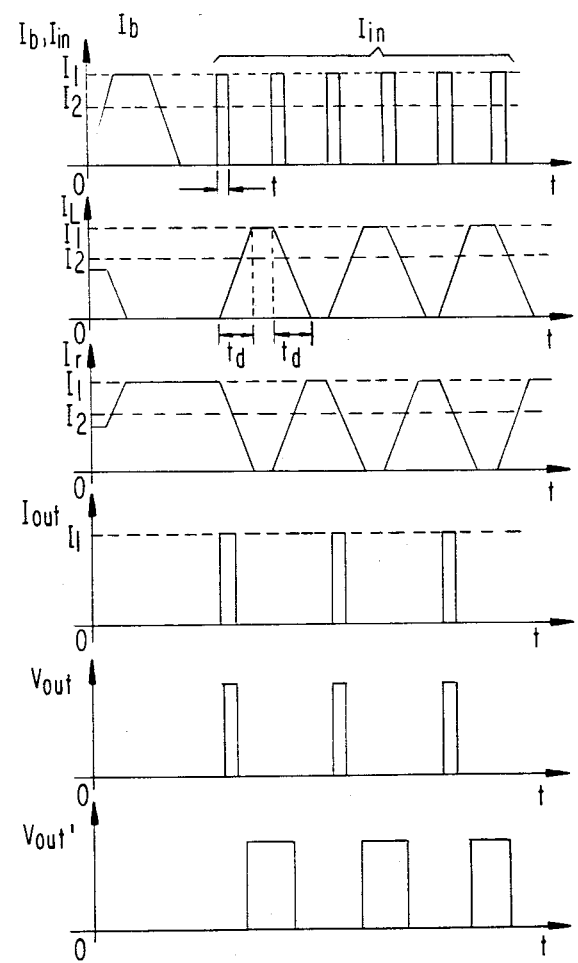
FIG. 3 is a waveform diagram showing signal waveforms appearing at various positions in FIG. 2 to be referred to for explaining the operation of the frequency divider shown in FIG. 2.

Now the frequency division operation will be described with reference to FIG. 3. This figure shows changes with time of the pulse current $I_b$, input signal current $I_{in}$, output voltage $V_{out}$, current $I_r$ flowing through the gate current path of the gate circuit 21, current $I_L$ flowing through the gate current path of the gate circuit 20, and pulse current $I_{out}$ flowing through the load resistor 23. Assuming that all the gate circuits in the illustrated embodiment have the same control characteristics, the amplitudes or magnitudes of the pulse current $I_b$, input signal current $I_{in}$ and D.C. current $I_{DC}$ are selected at the same value $I_1$. In this figure, a symbol $I_2$ represents a threshold value of a control current that is necessitated for transferring a gate circuit through which a gate current $I_1$ is flowing to the voltage state.

At first, when the initial pulse current $I_b$ is passed through the control current path 202 of the gate circuit 20 prior to commencement of the frequency division operation, the gate circuit 20 is transferred to the voltage state, and all the D.C. current $I_{DC}$ fed through the terminal 25 would flow through the route consisting of [the control current path 221 of the gate circuit 22]→[the gate current path of the gate circuit]→[the ground E₁](current I_r in FIG. 2). After interruption of the pulse current I_b, owing to the conservability of the magnetic flux in the superconductor loop forming the aforementioned current route, the D.C. current $I_{DC}$ continues to flow through the same route (thee clockwise loop). Since the D.C. current $I_{DC}$ flows into the control current path of the gate circuit 22 at this moment, when an input pulse current $I_{in}$ having a pulse width $\tau$ subsequently enters through the terminal 26, this pulse current $I_{in}$ flows through the control current path 211 of the gate circuit 21 to the load resistor 23 (current $I_{out}$ in FIG. 3). Then, as the gate circuit 21 transfers to the voltage state, all the D.C. current $I_{DC}$ fed through the terminal 25 would flow through the gate current path of the gate circuit 20 to the ground E₁ (current $I_L$ in FIG. 3). In order that this transfer of the D.C. current from the clockwise route to the counter clockwise route or vice versa can be achieved perfectly, the resistance of the damping resistors 27 and 28 is preset at the optimum value as described previously. After this pulse current $I_{in}$ has been interrupted, the gate circuit 21 which was transferred to the voltage state is reset and is returned to the zero voltage state. Thereafter, similarly to the above-described operation, owing to the conservability of the magnetic flux in the superconductor loop, the D.C. current $I_{DC}$ continues to flow through the counter-clockwise route.

When the next pulse current $I_{in}$ incomes through the input terminal 26, the gate circuit 22 remains in the zero voltage state because the D.C. current $I_{DC}$ is not flowing through the control current path 221 of the gate circuit 22, and hence the pulse current $I_{in}$ flows through the gate current path of the gate circuit 22 and through the control current path 201 of the gate circuit 20. Accordingly, the gate circuit 20 transfers to the voltage state, and all the D.C. current $I_{DC}$ flowing through the gate current path of the gate circuit 20 is transferred to the loop of the gate current path of the gate circuit 21. Subsequently, each time the pulse current $I_{in}$ arrives, similar operations are repeated, and therefore, a frequency-divided output voltage $V_{out}$ which has a frequency equal to one-half of the frequency of the input pulse signal $I_{in}$ can be obtained across the load resistor 23.

Figure 4:
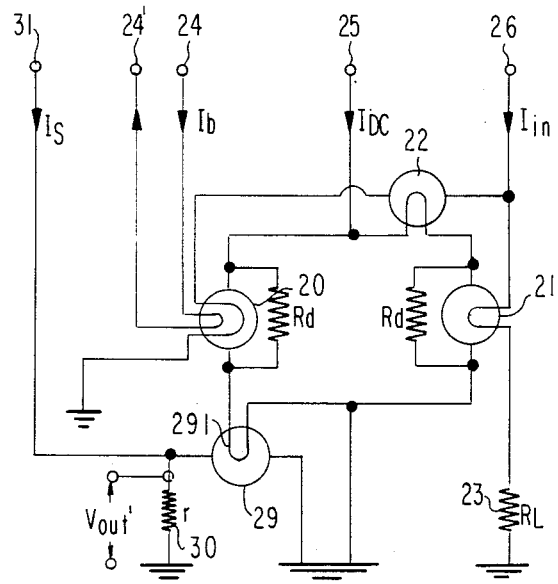
FIG. 4 is a circuit diagram showing another preferred embodiment of the present invention.

Another preferred embodiment of the present invention is illustrated in FIG. 4, which differs from that shown in FIG. 2 only in the section for deriving the frequency-divided output. In this modified embodiment, a control current path 291 of an additional gate circuit 29 is serially inserted between the gate current path of the gate circuit 20 and the ground E₁ in FIG. 2. One end of the gate current path of the gate circuit 29 is grounded, and the other end thereof is connected to a terminal 31 which is adapted to be fed with a D.C. current $I_s$ having a predetermined magnitude (in the illustrated embodiment, equal to I₁), and a load resistor 30 is connected in parallel to the gate current path. The resistance r of the load resistor 30 is selected at such a value that the gate circuit 29 can achieve a non-latching logic operation. With regard to the non-latching operation, detailed explanation can be found in U.S. Pat. No. 3,891,864.

The operation of the frequency divider illustrated in FIG. 4 is similar to that of the circuit shown in FIG. 2, except for the section including the gate circuit 29, and the frequency-divided output is derived as a voltage $V'_{out}$ appearing across the load resistor 30. More particularly, since the gate circuit 29 achieves a non-latching operation, when the D.C. current $I_{DC}$ is flowing through its control current path 291, the gate circuit 29 is in the voltage state, and hence the D.C. current $I_s$ flows through the load resistor 30. On the other hand, when the D.C. current $I_{DC}$ is not flowing through the gate current path of the gate circuit 20, and hence not through the control current path 291 of the gate circuit 29, the gate circuit 29 is in the zero voltage state, and therefore, the D.C. current $I_s$ flows through the gate current path of the gate circuit 29 ground. Accordingly, an output signal having a frequency which is ½ the input signal frequency can be derived as a voltage $V'_{out}$ appearing across the load resistor 30. The frequency-divided output signal $V'_{out}$ derived in this instance has a broadened pulse width as compared to the output signal $V_{out}$ in the case of the circuit shown in FIG. 2, as shown in FIG. 3. Accordingly, the circuits shown in FIGS. 2 and 4, respectively, could be selectively employed depending upon a required duty cycle ratio of the frequency-divided output signal.

As will be seen from the above description, if the input pulse current $I_{in}$ is not interrupted before completion of the transfer of the D.C. current $I_{DC}$ from the clockwise loop to the counter-clockwise loop or vice versa, then the transfer of the D.C. current $I_{DC}$ commences again in the opposite direction, and the D.C. current $I_{DC}$ is returned to the original current route. The time $\tau_d$ required for this transfer of the D.C. current can be represented in terms of the inductance L possessed by the aforementioned respective superconductor loops and the gap voltage $V_g$ of the superconductor forming the Josephson junction, as follows:

$$\tau_d \approx L \cdot I_{DC}/V_g$$

Accordingly, in order that the frequency divider making use of Josephson junction circuits according to the present invention can operate accurately, the following condition is necessitated:

$$\tau_d > \tau$$

($\tau$ being a pulse width of the input pulse current $I_{in}$)

At the same time, the upper limit frequency which can be divided by means of this frequency divider is given by $\tau_d^{-1}$ within the range where the switching time of the interferometer gate circuit can be neglected as compared to the time $\tau_d$. As it is possible to adjust the value of the time $\tau_d$ by changing the above-described inductance L by varying the physical size of the aforementioned superconductor loops, the upper limit frequency which can be divided by means of the frequency divider according to the present invention is restricted by the pulse width $\tau$ of the input pulse current $I_{in}$.

At present, it is possible to generate a pulse current signal having a pulse width of 10 ps or less by means of a pulse generator composed of Josephson junction circuits, and according to the present invention it is possible, in principle, to realize a frequency divider which can divide a frequency up to the proximity of the frequency $f \approx 1/10 \times 10^{12} \approx 100$ GHz.

While the flow route of the D.C. current $I_{DC}$ is preset by passing the initial pulse current $I_b$ through the control current path of either gate circuit 20 or 21 prior to commencement of the frequency division operation in the above-described preferred embodiment, even without passing the initial pulse current $I_b$ the frequency division operation can be achieved. For instance, in the case where the D.C. current $I_{DC}$ flows through the clockwise loop and hence the gate circuit 22 is in the voltage state, the first input pulse current $I_{in}$ flows through the control current path 211 of the gate circuit 21. Thus, after the first input pulse current $I_{in}$, the D.C. current $I_{DC}$ would flow through the counter-clockwise loop. On the contrary, in the case where the gate circuit 22 is in the zero voltage state, since the load resistor 23 is connected in series with the control current path 211 of the gate circuit 21, the first input pulse current $I_{in}$ flows through the control current path 201 of the gate circuit 20, and as a result the D.C. current $I_{DC}$ would flow through the clockwise loop. In either case, after the first received pulse current $I_{in}$ has been input, the direction of flow of the D.C. current $I_{DC}$ is definitely determined, and hence subsequently the same operation as that of the circuit shown in FIG. 2 can be achieved. Namely, since the gate circuit 22 always presents either one of the two states, the voltage state or zero voltage state, when the input signal $L_{in}$ is supplied, despite the flow direction and the amplitude of the D.C. current $I_{DC}$, the flow route of the input signal $I_{in}$ is determined depending upon the state of the gate circuit 22. One of the gate circuits 20 and 21 becomes voltage state according to the thus determined flow route of the signal $I_{in}$. However, it is to be noted that, as compared to the embodiment shown in FIGS. 2 and 4 in which the initial pulse current $I_b$ is fed, the timing relationship between the input pulse current signal $I_{in}$ and the frequency-divided output would become indefinite in the beginning of the operation.

Figure 5:
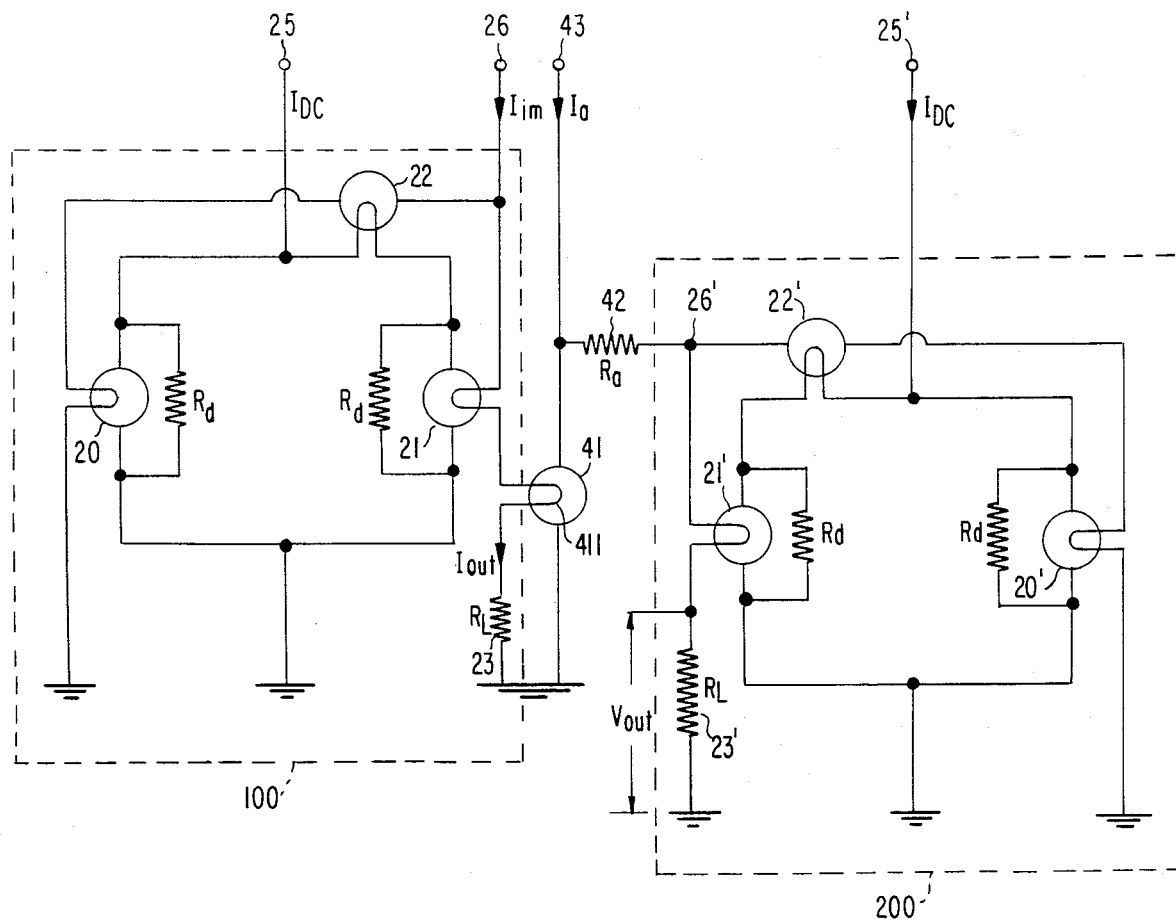
FIG. 5 is a circuit diagram showing still another preferred embodiment of the present invention in which the frequency-division ratio can be arbitrarily enlarged.

A construction of a frequency divider according to still another preferred embodiment of the present invention, in which a frequency division ratio of $\frac{1}{4}$ can be realized, is illustrated in FIG. 5. In this figure, two frequency dividers according to the preferred embodiment shown in FIG. 2 (in this instance, the initial pulse current $I_b$ being not fed to the dividers) as represented by dash-line frames 100 and 200 are cascaded by the intermediary of a gate circuit 41. More particularly, a control current path 411 of the gate circuit 41 is inserted in series with the load resistor 23 of the frequency divider 100, one end of a gate current path of the gate circuit 41 is connected to a terminal 43 which is adapted to be fed with a D.C. current $I_a$ having a predetermined magnitude and also to one end of a resistor 42, and the other end of the gate current path of the gate circuit 41 is grounded. In addition, the other end of the resistor 142 is connected to an input terminal 26' of the frequency divider in the next stage as represented by the dash line frame 200. It is to be noted that the circuit design is made such that the gate circuit 41 can achieve a non-latching logic operation, by appropriately selecting a resistance $R_a$ of the resistor 42 and a resistance $R_L$ of a load resistor 23' of the frequency divider 200. The remaining portions of the frequency dividers 100 and 200 are identical to the embodiment shown in FIG. 2.

The operation principle of this preferred embodiment is as follows. That is, through the load resistor 23 of the frequency divider 100 flows a pulse current $I_{out}$ which has been divided in frequency into $\frac{1}{2}$ as explained in connection to the embodiment shown in FIG. 2. When the pulse current $I_{out}$ flows through the control current path 411 of the gate circuit 41, the gate circuit 41 transfers to the voltage state, and a D.C. current $I_a$ flows to the input terminal 26' of the frequency divider 200 via the resistor 42. On the other hand, when the pulse current $I_{out}$ is not flowing through the control current path 411 of the gate circuit 41, the gate circuit 41 returns to the zero voltage state, hence the D.C. current $I_a$ would not flow to the input terminal 26'. Accordingly, an input pulse current having the same repetition cycle as the signal divided in frequency into $\frac{1}{2}$ by the frequency divider 100 would flow to the input terminal of the frequency divider 200, and as a result, an output voltage signal $V_{out}$ which has been divided in frequency into $\frac{1}{4}$ would appear across the load resistor 23' of the frequency divider 200.

By cascading a desired number of frequency dividers as shown in FIGS. 2 or 4 in a similar manner to the above-described circuit, a signal having a frequency divided into $\frac{1}{2}, \frac{1}{4}, \ldots, \frac{1}{2^n}, \ldots$ of the fundamental frequency can be derived.

It is to be noted that for the gate circuits in the above-described embodiments of the present invention, an interferometer gate circuit, as in-line gate circuit or a combination thereof could be employed. In addition, even when the control characteristics of the gate circuits are not identical, it is only necessary to select the control current and the gate current so as to surely transfer the gate circuit in question from the voltage state to the zero voltage state or vice versa.

What is claimed is:

1. A frequency divider circuit having a first frequency divider comprising first, second and thrid gate circuits each including a Josephson junction having a gate current path and a control current path, each said Josephson junction, in response to a control current flowing in its control current path, assuming a voltage state in which it presents an impedance to current flowing in its gate current path, and in response to the absence of said control current flowing in said control current path, assuming a zero voltage state in which it presents substantially no impedance to current flowing in its gate current path, the gate current paths of said first and second gate circuits being connected in parallel to each other between first and second parallel connection junctions, the control current path of said third gate circuit being connected between one of said parallel connection junctions and the gate current path of said first gate circuit, a first terminal adapted to be fed with a D.C. current having a sufficient magnitude for bringing said third gate circuit into the voltage state being connected to said one of said parallel connection junctions, a first resistor having a predetermined resistance and connected in series with the control current path of said first gate circuit to form a first series connection, said gate current path of said third gate circuit and control current path of said second gate circuit being connected in series to form a second series connection, and an input terminal receiving an input pulse signal to be frequency divided connected in common to said first and second series connections.

2. A frequency divider circuit as claimed in claim 1, in which said second gate circuit is provided with another control current path connected to a second terminal which is fed with an initial pulse current having a sufficient amplitude for bringing said second gate circuit into the voltage state.

3. A frequency divider circuit as claimed in claim 1, in which damping resistors each having a predetermined resistance are respectively connected in parallel to the gate current paths of said first and second gate circuits.

4. A frequency divider circuit as claimed in claim 1, further comprising means for deriving a frequency-divided output from said first resistor.

5. A frequency divider circuit as claimed in claim 1, in which the other of said parallel connection junctions is connected to a reference potential and said first terminal is connected via said first series connection and via said second series connection to the reference potential.

6. A frequency divider circuit as claimed in claim 1, 2 or 3, further comprising a fourth Josephson junction gate circuit and a second resistor having a predetermined resistance, the control current path of said fourth gate circuit being connected in series between a reference potential and the gate current path of one of said first or second gate circuits one end of the gate current path of said fourth gate circuit being connected to a third terminal adapted to be fed with a D.C. current having a predetermined magnitude, said second resistor being connected between said one end of the gate current path of said fourth gate circuit and said reference potential, said first frequency divider circuit further comprising means for deriving a frequency-divided output from said second resistor.

7. A switching circuit comprising first, second and third Josephson junction gate circuits each including a control current path and a gate current path which presents either one of a voltage state and a zero voltage state in response to a control current flowing through the associated control current path, each said Josephson junction gate circuit in its voltage state presenting an impedance to current flow through its gate current path and in its zero voltage state presenting substantially no impedance to current flowing through its gate current path, a D.C. current terminal, an input current terminal, a first current path including the gate current path of said first Josephson junction gate circuit and the control current path of said second Josephson junction gate circuit, a second current path including the gate current path of said third Josephson junction gate circuit, a third current path including the control current path of said first Josephson junction gate circuit, a fourth current path including the gate current path of said second Josephson junction gate circuit and the control current path of said third Josephson junction gate circuit, means for providing a D.C. current through either one of said first and second current paths via said D.C. current terminal, and means for providing an input current through either one of said third and fourth current paths via said input current terminal.

8. A switching circuit as claimed in claim 7, further comprising a fourth Josephson junction gate circuit having a control current path and a gate current path, said control current path of said fourth Josephson junction gate circuit being included in said second current path, one end of said gate current path of said fourth Josephson junction gate circuit being connected to a reference potential, a resistor coupled between said reference potential and the other end of said gate current path of said fourth Josephson junction gate circuit, and means for providing a substantially continuous D.C. current through said gate current path of said fourth Josephson junction gate circuit.

9. A frequency divider circuit as claimed in claim 1, further comprising:
a second frequency divider (200) identical to said first frequency divider (100) and having an input terminal (26'),
a fourth Josephson junction gate circuit (41) having its control current path connected in series with said control current path of said first gate circuit (21) of said first frequency divider (100) between said first resistor (23) of said first frequency divider (100) and the common connection point in said first frequency divider (100) of said input terminal (26) of said first frequency divider to said first and second series connections of said first frequency divider,
means for applying a current (Ia) through the gate current path of said fourth Josephson junction gate circuit one end of which gate current path is coupled to a reference potential, and
resistance means (42) coupled between the other end of said fourth Josephson junction gate circuit gate current path and said input terminal (26') of said second frequency divider (200).

* * * * *

UNITED STATES PATENT AND TRADEMARK OFFICE
CERTIFICATE OF CORRECTION

PATENT NO. : 4,489,424

DATED : December 18, 1984

INVENTOR(S) : Junichi SONE,

It is certified that error appears in the above-identified patent and that said Letters Patent is hereby corrected as shown below:

Column 2, line 2, "as" should be --at--;

line 60, "divider" should be --divided--.

Column 4, line 28, "stage" should be --state--.

Column 5, line 3, after "circuit", insert --21--;

line 8, "(thee" should be --(the--.

Column 6, line 13, after "29", insert --to--.

Column 7, line 17, delete "received" and insert --input--;

line 17, after "been", change "input" to --received--;

line 23, "$L_{in}$" should be --$I_{in}$--;

line 52, "142" should be --42--.

Column 8, line 21, "as" should be --an--.

Signed and Sealed this

Third Day of September 1985

[SEAL]

Attest:

DONALD J. QUIGG

*Attesting Officer*  *Acting Commissioner of Patents and Trademarks - Designate*